United States Patent [19]

Rodrigalvarez Nieto et al.

[11] 3,727,140

[45] Apr. 10, 1973

[54] UHF AND VHF TUNER FOR TELEVISION

[76] Inventors: Carlos Rodrigalvarez Nieto, Torre Izarra 14; Luis Arteaga Vera, Uriburu 19, both of Mondragon, Spain

[22] Filed: Oct. 9, 1969

[21] Appl. No.: 865,029

[30] Foreign Application Priority Data

Oct. 11, 1968 Spain ....................................359,059

[52] U.S. Cl. ..................325/458, 325/459, 325/318, 334/47

[51] Int. Cl. ...............................................H04b 1/18

[58] Field of Search......................325/317, 319, 373, 325/374, 375, 376, 379, 383, 384, 388, 452, 458, 459, 461, 464, 468; 330/21, 31; 334/14, 15, 47

[56] References Cited

UNITED STATES PATENTS

| | | | |
|---|---|---|---|
| 3,482,178 | 12/1969 | Habian | 330/31 X |
| 3,252,095 | 5/1966 | Carlson | 325/459 |
| 3,354,397 | 11/1967 | Wittig | 325/459 |
| 3,376,508 | 4/1968 | Jones | 325/459 |
| 3,458,819 | 7/1969 | Cafarella et al. | 325/461 X |
| 3,509,467 | 4/1970 | Cole | 325/452 |
| 3,528,044 | 9/1970 | Manicki | 334/15 |
| 3,264,566 | 8/1966 | Kaufman et al. | 325/465 |

FOREIGN PATENTS OR APPLICATIONS

| | | | |
|---|---|---|---|
| 294,572 | 3/1967 | Australia | 325/464 |

*Primary Examiner*—Benedict V. Safourek
*Attorney*—Wenderoth, Lind & Ponack

[57] ABSTRACT

UHF and VHF tuner for television. The tuner has a radioamplifier for all bands in which silicon transistors with amplifying elements are used. The transistor of the radioamplifier is used in common emitter for UHF and in common base for VHF, the commutation of bands being accomplished by means of diodes of commutation. The oscillator-mixer for the UHF is formed of a transistor in common base while the local oscillator of the UHF band uses as a variable capacity diode a variable tuning element. The VHF oscillator which uses a transistor in common emitter amplifies the intermediate frequency (I.F.) of the UHF.

7 Claims, 1 Drawing Figure

PATENTED APR 10 1973 3,727,140
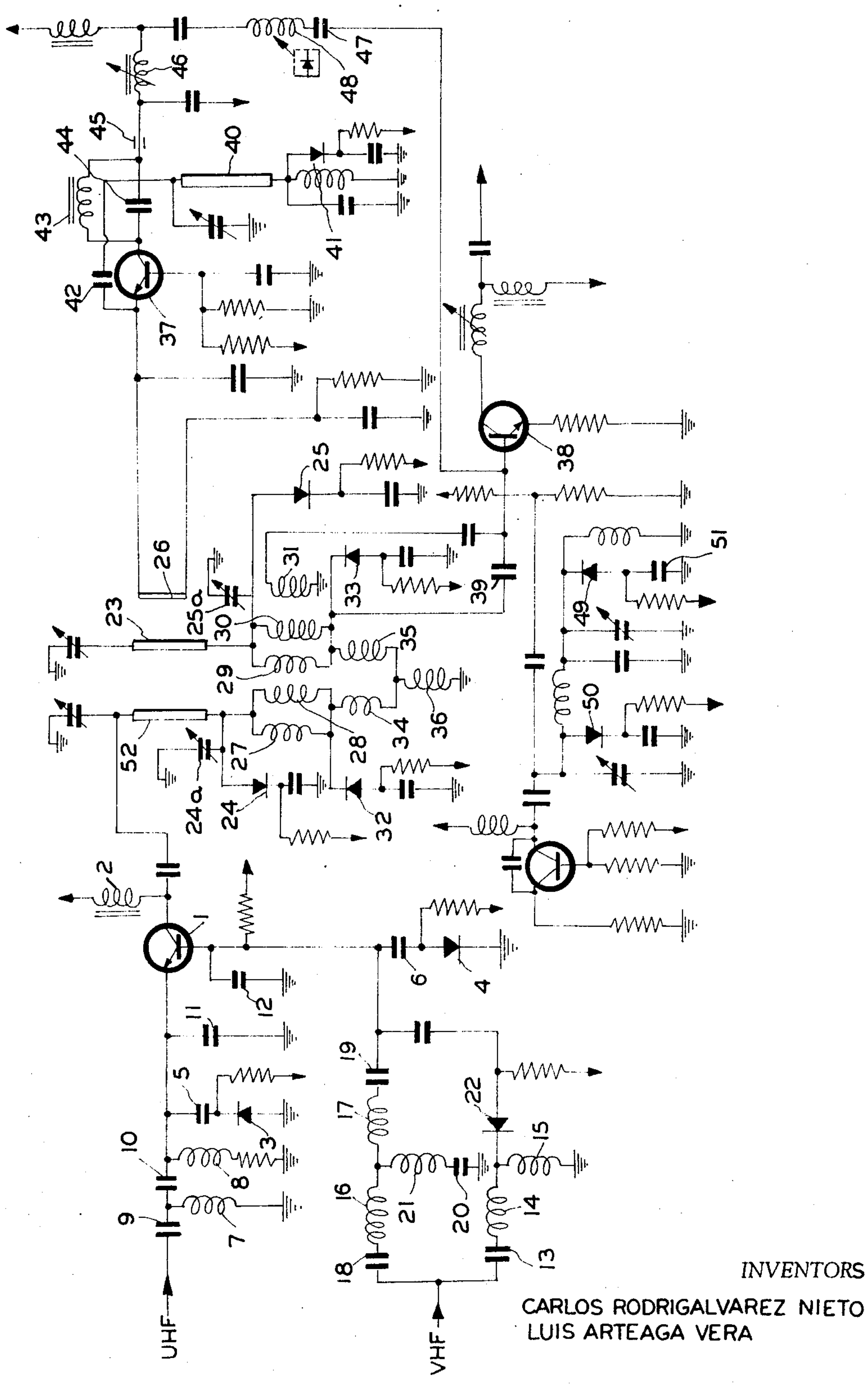
INVENTORS
CARLOS RODRIGALVAREZ NIETO
LUIS ARTEAGA VERA
BY *Wenderoth, Lind & Ponack*
ATTORNEYS

UHF AND VHF TUNER FOR TELEVISION

The present invention relates to a transistorized integrated tuner for a television receiver which is suitable to tune the receiver to receive signals in both the VHF and UHF bands.

The tendency in the design of television apparatus is to provide one tuner for all the bands, which permits operation in two steps for the VHF and UHF bands. These tuners employ as active elements transistors and as variable elements for tuning diodes of variable capacity. In this manner it is possible to obtain the desired tuning by means of the modification of one continuous voltage which is applied to said diodes. In this way there is eliminated, among other things, the phenomenon known as Microphonicity.

In spite of the fact that said variable capacity diodes have a rather great relative variation in capacity, it is extremely difficult to utilize the same circuits for the reception of all bands, and for this reason it is necessary to utilize switching means. When said switching means are mechanical means, they have some drawbacks, for example with respect to deterioration, excessive size, and so on.

The present invention seeks to overcome the deficiencies of prior art tuners by providing an integrated tuner in which the switching to different bands is accomplished by electronic means, in which are employed switching diodes. Said electronically integrated tuner employs these diodes for the continuous turning by switching of bands, and at the same time employs transistors as amplifier elements.

The features and characteristic of the present invention will become clear from the following specification, taken with the accompanying drawing which is a circuit diagram of one preferred form of the invention.

The integrated tuner of the invention has one amplifier for all the bands, one oscillator — mixer for the UHF band, one local oscillator for the VHF band, and one mixer for the VHF band which amplifies the intermediate frequency of the UHF band.

The amplifier for all the bands has one NPN type silicon transistor 1 having a common emitter for the VHF band and a common base for the UHF band.

Said transistor is supplied from a voltage source (not shown) with a voltage of 12 Volts through the coil 2. The change from UHF to VHF is accomplished by means of two diodes 3 and 4 respectively coupled to the emitter of the transistor 1 by means of a first bypass capacitor 5 and to the base of the transistor 1 by means of another capacitor 6. When the diode 3 is not conducting, i.e., is blocking the diode 4 conducts connecting the base of the transistor to ground blocking the reception of the VHF signal. The UHF signal reaches the base of the transistor 1 by means of the filter means formed by the coils 7 and 8 and capacitors 9 and 10. The capacitor 11 is disposed in parallel with the emitter and the condenser 12 is disposed with the base of the transistor. The capacitor 11 permits compensating of the negative capacity of the emitter of transistor 1 as long as capacitor 12 has a sufficiently great value to decouple the base for UHF reception.

For VHF reception the diode 4 is blocking as long as diode 3 connects the emitter to ground during the reception of VHF.

The filter for Band III of the VHF bands having a frequency between 170 and 220 $MH_z$ is formed by capacitor 13 which is resonant at the center frequency of the Band III and self-induction coil 14 in series therewith. This is followed by other coil 15 connected to ground. This coil 15 resonates in parallel with the capacitor 12 at the center frequency of the Band III in order that this capacitor does not connect the signal III to ground.

The filter for Band I of the VHF band having a frequency between 50 and 90 $MH_z$ is connected in parallel with the filter for Band III and is of the asymmetric T type having the two arms of the T formed of self-induction coils 16 and 17 and capacitors 18 and 19. These capacitances and self-induction coils resonate at the center of the Band at 58 $MH_z$. The foot of the T is composed of one capacitor 20 and the coil 21 which resonate at 36 $MH_z$. The assembly is a doubly integrated circuit with one reciprocal coupling which is constituted by said foot.

The diode 22 is a switching diode which, when it does not conduct, causes the circuit to receive the Band I signals, and when it conducts, passes the signals of the Band III signals to the base of transistor 1 while the signals of the Band I are grounded due to the very small reactance of the coil 15. The ratio of the capacitances 18 and 19 is about 2 to 1.

In the output of the filter for the UHF band signals is formed by two lines 52 and 23 of the type of L/2 (Lambda/2), which are lines of medium wave length, also called lines of open circuit. These two lines are coupled and in the ends are disposed tuning diodes 24 and 25 which can be tuned by variable capacitors **24*a* and 25*a*. The impedance characteristic of the lines 52 and 23 on the order of 110 – 140Ω.**

The secondary of the filter transfers the energy to the oscillator-mixer for the UHF band by means of a loop 26.

For the Band III of the VHF the band filter is composed of the self-induction coils 27 and 28 magnetically coupled with coils 29 and 30. The secondary of the filter transfers the energy of the electric current to the mixer for the VHF band by means of a coil 31 which has 2 to 3 turns.

The two self-induction coils which constitute the filter for the Band III constitute one impact for the UHF signal so that there is obtained two frequencies of tuning simultaneously, one in the UHF band and the other in the Band III for each value of the capacity of the tuned diodes 24 and 25 when the switching diodes 32 and 33 conduct short-circuiting the coils of the Band I filter. The filter for Band I is constituted by the coils 34 and 35 coupled to coil 36. When the switching diodes 32 and 33 are blocked the assembly of the coils resonates by the capacities of the variable capacity diodes in the Band I filter, thus obtaining tuning in said Band.

The required switching voltages and their polarity for the diodes 4, 22, 24, 32, 50, 49, 25 and 32 are as follows:

Diode 4:
- + 12 volts for UHF
- – 12 volts for VHF

Diode 22:
- + 12 volts for band III
- – 12 volts for band I

Diode 24: has variable capacity

Diode 32:

+12 volts for band III
−12 volts for band I
Diode 50: has variable capacity
Diode 49:
+12 volts for band III
−12 volts for band I
Diode 25: has variable capacity
Diode 33:
+12 volts for band III
−12 volts for band I The transfer of energy from the secondary to the transistor 38 of the mixer is through fixed value capacitor 39.

In the doubly tuned filter for the radiofrequency, the coils of the Band I, Band III and the L/2 (Lambda/2) lines for UHF are in series in the primary as well as in the secondary of said filter.

The oscillator-mixer for the UHF band includes an NPN transistor 37 with a common base connection is tuned with the circuit of the collector of one L/2 (Lambda/2) line 40 having a variable capacity tunable diode connected in series with the line 40 and ground. The diode is thus tuned while feedback from line 40 to the emitter of transistor 37 is through the capacitor 42. A coil 43 connected in parallel with capacitor 44 in the collector circuit of the transistor 37 to form the impact of the frequency of the local oscillator. The primary of the filter for intermediate frequency is constituted by a capacitor 47 and a coil 48. The secondary is coupled to the base of the transistor 37 of the mixer for the VHF band, which serves as an amplifier for the intermediate frequency of the UHF band. A typical impedance is from 110 to 140.

In the local oscillator for the VHF band the diode 49 is the commutation diode while the diode 50 is a variable capacity diode.

The negative voltage charge on the capacitor 51 across the diode 49 and reverse on radiofrequency diodes is what switches over the tuner to the Band I or the Band III.

The L/2 (Lambda/2) lines of the primary and secondary of the filter for the radiofrequency band and the line L/2 (Lambda/2) of the oscillator-mixer have lengths on the order of 30 to 35 centimeters (11.8110 at 13.7795 inches).

There is thus provided a compact tuner with capacity to receive all the television frequencies. It is not necessary to carry out any mechanical manipulation to change from the reception of the VHF bands to reception of UHF bands because said operations are accomplished by simple continuous voltages.

We claim:

1. In a UHF and VHF tuner for television having a circuit having a radioamplifier transistor in a common emitter configuration for VHF and in a common base configuration for UHF, an improvement in means for changing the circuit configuration for the transistor, said improvement comprising a first diode having the anode grounded, a first condenser in the circuit between the first diode and the emitter of said transistor so that when the diode is conductive the high frequency currents are short-circuited to ground, whereby the transistor is connected in the circuit in a common emitter configuration for VHF, an admittance filter for the VHF band signals coupled to said base of said transistor for connecting the circuit in common base configuration for UHF and comprised of two filters in parallel, one for Band I signals and the other for the Band III signals, the filter for Band III VHF signals having one capacitor and a self-induction coil in series with said capacitor forming a series resonant circuit which resonates at the center of the Band III, a further capacitor coupled between the base and emitter of said transistor, and a further coil coupled between said self-induction coil and ground which is in parallel with the further capacitor, a second diode in series with said Band III filter, said Band I filter being an asymmetric type filter with reactance to ground having a T section configuration with two arms each having a capacitor and self-inductances which resonate at the center of the Band I at a frequency of 58 $MH_z$, and further having a base composed of a capacitor and a coil connected to the junction between said legs and ground and resonating at a frequency of 36 $MH_z$ forming a doubly tuned circuit with a mutual coupling of said base, whereby the Band I filter operates when said second diode does not conduct and the Band III filter operates when said second diode conducts so that the signal at the frequency of Band III is conducted to the base of the transistor while the signals of the Band I filter are grounded.

2. The improvement as claimed in claim 1 further comprising radiofrequency band filter of a doubly tuned type in the form of a transformer for very high frequency and having a resonant primary and secondary and having coils for Band I and Band III signals and a λ/2 (Lambda/2) line for UHF signals being all in series in the primary and in the secondary of said filter.

3. The improvement as claimed in claim 2 in which the band filter for UHF signals comprises λ/2 (Lambda/2) lines having characteristic impedances on the order of 110 at 140 ohms and having at the ends diodes and variable capacitors for tuning the diodes.

4. The improvement as claimed in claim 2 in which the band filter for UHF signals comprises λ/2 (Lambda/2) and open circuits having characteristics impedances on the order of 110 at 140 ohms and having at the ends diodes and variable capacitors for tuning the diodes.

5. The improvement as claimed in claim 3 further comprising a mixer for the VHF signals having a transistor and a plurality of coils coupled thereto and magnetically coupled with the coil of the secondary of the filter for the Band III signals and having a capacitor coupled with the secondary of the filter for the Band I signals.

6. The improvement as claimed in claim 3 further comprising an oscillator-mixer for the UHF band signals comprising a transistor coupled in a common base configuration and having a tuning circuit coupled to the collector with a λ/2 (Lambda/2) line and a diode having a variable capacitor coupled to the end thereof and having a characteristic impedance on the order of 110 to 140 ohms.

7. The improvement as claimed in claim 6 in which the λ/2 (Lambda/2) lines of the primary and secondary of the radiofrequency band filter and the λ/2 (Lambda/2) line of the oscillator have lengths on the order of 30 to 35 centimeters.

* * * * *